United States Patent
Axholt

(10) Patent No.: US 9,197,257 B2
(45) Date of Patent: Nov. 24, 2015

(54) HARMONIC FILTERING FOR AN UP-CONVERTING, VOLTAGE MODE, PASSIVE MIXER

(71) Applicant: ST-Ericsson SA, Plan-les-Ouates (CH)

(72) Inventor: Andreas Axholt, Lund (SE)

(73) Assignee: ST-ERICSSON SA, Plan-les-Ouates (CH)

( * ) Notice: Subject to any disclaimer, the term of this patent is extended or adjusted under 35 U.S.C. 154(b) by 0 days.

(21) Appl. No.: 14/217,876

(22) Filed: Mar. 18, 2014

(65) Prior Publication Data

US 2014/0349716 A1    Nov. 27, 2014

Related U.S. Application Data

(60) Provisional application No. 61/825,695, filed on May 21, 2013.

(51) Int. Cl.
| | |
|---|---|
| *H04B 1/04* | (2006.01) |
| *H04B 17/00* | (2015.01) |
| *H04W 52/02* | (2009.01) |
| *H03D 7/14* | (2006.01) |
| *H03D 7/16* | (2006.01) |

(52) U.S. Cl.
CPC ........... *H04B 1/0475* (2013.01); *H03D 7/1441* (2013.01); *H03D 7/1466* (2013.01); *H03D 7/165* (2013.01); *H04W 52/0261* (2013.01); *H03D 2200/0074* (2013.01); *H03D 2200/0086* (2013.01); *H04B 2001/0441* (2013.01)

(58) Field of Classification Search
CPC ........................... H04B 1/0475; H04B 1/7101
USPC ........ 455/63.1, 67.13, 114.1, 114.2; 375/296, 375/297
See application file for complete search history.

(56) References Cited

U.S. PATENT DOCUMENTS

| | | | |
|---|---|---|---|
| 5,838,210 A | 11/1998 | Midya et al. | |
| 6,862,441 B2 * | 3/2005 | Ella ............................ | 455/114.2 |
| 7,436,274 B2 * | 10/2008 | Shih ............................. | 333/204 |
| 8,432,211 B2 * | 4/2013 | Choksi et al. ................. | 327/355 |
| 8,482,335 B2 * | 7/2013 | Ze .................................. | 327/355 |
| 8,731,099 B2 * | 5/2014 | Giannini et al. .............. | 375/295 |
| 8,750,813 B2 * | 6/2014 | Pan ............................. | 455/127.2 |

(Continued)

FOREIGN PATENT DOCUMENTS

WO     2009/003101 A2     12/2008

OTHER PUBLICATIONS

International Search Report issued in corresponding International application No. PCT/IB2014/000776, date of mailing Oct. 7, 2014.

(Continued)

*Primary Examiner* — Quochien B Vuong
(74) *Attorney, Agent, or Firm* — Patent Portfolio Builders PLLC

(57) ABSTRACT

Disclosed herein is a passive, voltage mode transmitter assembly and method of operation. The passive, voltage mode transmitter assembly comprises a baseband filter configured to filter a source baseband signal, a harmonics filter, connected to the baseband filter, configured to remove harmonics from the filtered, source baseband signal, a passive, voltage mode mixer, connected to the harmonics filter, configured to up-convert an output of the harmonics filter to a radio signal, and a power amplifier, connected to the passive, voltage mode mixer, configured to amplify the radio signal.

15 Claims, 18 Drawing Sheets

(56) References Cited

U.S. PATENT DOCUMENTS

2010/0171542 A1    7/2010  Dawe et al.
2010/0297970 A1    11/2010 Pan

OTHER PUBLICATIONS

Written Opinion of the International Searching Authorityissued in corresponding International application No. PCT/IB2014/000776, date of mailing Oct. 7, 2014.

Tan, Sam Chun-Geik et al., "An Ultra-low-cost Bluetooth SOC in 0.11-μm CMOS," 2011 IEEE Asian Solid-State Circuits Conference (A-SSCC), Nov. 14-16, 2011, Jeju, Korea, pp. 365-368, XP032090566, DOI: 10.1109/ASSCC.2011.6123591; ISBN: 978-1-4577-1784-0.

Kihara, Takao, et al., "A Multiband LTE SAW-less CMOS Transmitter with Source-Follower-Drived Passive Mixers, Envelope-Tracked RF-PGAs, and Marchand Baluns," 2012 IEEE Radio Frequency Integrated Circuits Symposium (RFIC), Jun. 17-19, 2012, pp. 399-402, Montreal, Quebec, Canada, ISBN: 978-1-4673-0415-3; DOI: 10.1109/RFIC.2012.6242308.

D'Souza, Sandeep, et al., "A Programmable Baseband Anti-Alias Filter for a Passive-Mixer-Based, SAW-less, Multi-Band, Multi-Mode WEDGE Transmitter," 2011 IEEE International Symposium on Circuits and Systems (ISCAS), May 15-18, 2011, pp. 450-453, Rio de Janeiro, Brazil, ISBN: 978-1-4244-9473-6, DOI: 10.1109/ISCAS.2011.5937599.

Fabiano, Ivan, et al., "SAW-less Analog Front-End Receivers for TDD and FDD," 2013 IEEE International Solid-State Circuits Conference Digest of Technical Papers (ISSCC), Feb. 17-21, 2013, pp. 82-83, ISBN: 978-1-4673-4515-6, DOI: 10.1109/ISSCC.2013.6487646.

* cited by examiner

HARMONIC FILTERING FOR AN UP-CONVERTING, VOLTAGE MODE, PASSIVE MIXER

PRIORITY INFORMATION

The present application claims priority under 35 U.S.C. §119(e) to U.S. Provisional Patent Application Ser. No. 61/825,695, filed May 21, 2013, the entire contents of which are expressly incorporated herein by reference.

TECHNICAL FIELD

The present invention generally relates to transmitters used in communication devices and, more specifically, to up-conversion of a signal to be transmitted by such devices using a voltage mode passive mixer.

BACKGROUND

Modulators are used in radio communication devices when, for example, frequency conversion is needed, such as up- and down-converting between baseband and radio carrier frequencies. Frequency conversion is performed by multiplying the input signal with a tone that has energy at the wanted frequency. A common implementation to achieve frequency conversion is to use a passive mixer and switch the polarity of the signal at the rate of the carrier frequency.

A passive mixer is an electronic circuit device configured to perform frequency conversion using one or more passive devices, such as diodes, versus active devices such as amplifiers, whether in the form of operational amplifiers (op-amps), in one example, or one or more transistors configured to perform the amplification/mixing function. Passive mixers use less power, are simpler in configuration and generally, with the proper selection of passive devices, have good (i.e., low) intermodulation distortion. Passive mixers, because of their "non-active" nature, cannot and do not add any gain to the output signal, and hence if signal level is important or critical an additional amplifier (or more) maybe needed to get the signal to the desired level. Or, in other words, by definition passive devices will suffer conversion loss. To avoid excessive noise contribution, the switching transitions between conducting and non-conducting modes are made short. During the transitions, the output voltage level is related to the level of the multiplying tone. As the amplitude of the multiplying tone is further increased or decreased, however, the gain saturates, which makes the tone multiplication with the input signal mimic multiplication of the input signal with a square wave. The Fourier expansion of a square wave shows that the multiplication tone also carries strong odd-harmonic components, e.g., at three, five, seven, and so on, times the carrier frequency.

Thus, performing frequency conversion by multiplication of the input signal with what is essentially a square wave introduces odd harmonics. For example, in a transmitter consider that the baseband signal, represented as $f_{BB}$, is up-converted to $1 \times F_c + f_{BB}$, where $F_c$ is the carrier frequency. However, due to the multiplication with a square wave there is also an unwanted frequency up-conversion of a third order harmonic to $3 \times F_c - f_{BB}$. In a succeeding stage of the transmitter, such as a power amplifier stage that operates close to compression due to the efficiency benefits of such an operation, these harmonic tones inter-modulate and create out-of-band energy at $1 \times F_c - 3 \times f_{BB}$, potentially violating standards related to noise requirements, such as those promulgated by 3GPP for LTE. Therefore, filtering the up-converted signal after the mixer and before amplification by, e.g., a nonlinear amplifier, can be important. In particular, such filtering can be important for the third order harmonic as the third order nonlinearity of a typical CMOS amplifier is larger than its fifth order nonlinearity.

To achieve lower third order harmonic levels, existing solutions propose multiplication of several different tones, each with a different phase, to mimic multiplication of the input signal to be converted with a sinusoidal wave instead of a square wave. A major drawback to this solution is the complexity and current consumption (i.e., power) when generating these phases. The power consumption of the circuits generating the multiphase tones is directly proportional with frequency, making the topology unsuitable for high frequency operation where low power consumption is needed. Devices wherein such considerations could be important include, among others, handheld cellular phones, and other transmitter devices with up-converters that operate in voltage mode wherein suppression of odd-order harmonics could be of importance.

Another existing solution is the use of an active mixer, and more particularly an active current-mode mixer, rather than a passive mixer to perform the frequency conversion. Voltage mode and current mode are two regulating conditions that control the output of a source of a signal. A voltage source can provide a constant or changeable output voltage as current is drawn from 0 to the full rated current specification of the signal generator. In these applications, while the signal generator runs in voltage mode, it maintains the output voltage while providing the required current to the load. A signal generator is generally modeled as providing a low output impedance when operating in voltage mode. Current mode works in a similar fashion, except it limits and regulates the output current of the signal generator to the desired level. When the signal generator runs in current mode, the signal generator provides a constant current into a variety of load voltage conditions including a short circuit. A signal generator operating in current mode is generally modeled as providing a very high output impedance. Note that in both cases the voltage of the signal generator will change (because it is a modulating signal) but in the voltage mode case, the current level will be variable, while in the current mode case, the current is substantially more fixed. As discussed in greater detail below, current mode devices are usually used in high power, i.e., high frequency, transmitters and receivers.

A generalization of a simple, active current mode mixer 100 is shown in FIG. 1A. The term "simple" refers to number of inputs and configuration of the mixer. Mixers can be complex, meaning it has both an I and Q input, and therefore an I and Q local oscillator signal, known to be 90° out of phase with each other. A simple, mixer, on the other hand, is not complex, meaning it does not have I and Q inputs, and only one LO input signal. However, as known to those of skill in the art, because many circuits now transmit data using differential or complementary type signals (i.e., a "+" signal and an opposite polarity "−" signal, for purposes of noise immunity, the LO's will also need to be provided in terms of a "+" and "−" configuration, meaning of opposite polarity). Therein, the active current mode mixer circuit 100 includes baseband (BB) filter 104, which not only provides a baseband signal to the mixer, but also filters it before being fed into a buffer or common current source stage 105. Following buffer or common current source stage 105 is active mixer 106, which performs the up-conversion to RF frequencies. The output of active mixer 106 can be filtered with an RC or LC network, generally represented by harmonics filter 108, due to the high output impedance of the active mixer 106. The filtered RF signal can then be amplified by power amplifier 110 and coupled to antenna 112 for transmission. However, the benefits of the passive, voltage mode sampling mixer, especially good or low intermodulation distortion, are lost if active mixer 106 is used in the transmit chain.

Those of skill in the art can appreciate that the harmonics could be filtered in a passive, voltage mode sampling mixer circuit 120 as generally shown in FIG. 1B between mixer 124 and power amplifier 128, as was discussed above with respect to the active, current mode mixer assembly 100. Therein, elements 122-130 perform generally the same functions as elements 104-112 (those are similarly named), respectively, but without the signal being driven by a current source (i.e., 105), i.e., a passive mixing circuit. However, attempting to filter the output of passive voltage mode sampling mixer 124 with harmonics filter 126 yields somewhat poor results because the required low source impedance, which is up-converted from baseband to the carrier frequency, lowers the Q value (or Q-factor) of harmonics filter 126, which can be typically provided as an LC circuit. A low Q-factor means a higher bandwidth, generally allowing more noise to pass through harmonics filter 126 and then to power amplifier 128. Increasing the source impedance, for all frequencies, degrades the conversion gain.

Another option is to filter the signal after power amplifier 146 as is done in passive, voltage mode sampling mixer assembly 140 shown generally in FIG. 1C. In FIG. 1C, elements 142-150 correspond respectively to similarly labeled (i.e., named) elements 122-130 of FIG. 1B. By filtering the signal after power amplifier 146 instead of between mixer 144 and power amplifier 146, distortion created in the trans-conductance stage of power amplifier 146 is not filtered by harmonics filter 148. Instead, only distortion due to voltage swing at the output of power amplifier 146 is filtered by harmonics filter 148, and it therefore can operate much better than in the alternative scenario. The former distortion, the trans-conductance stage output of the amplifier, is at a frequency location that is very close to the signal frequency which makes filtering it very difficult. The latter distortion, that which is due to the voltage swing, is located at a frequency that is more conducive to filtering in the afore-described manner.

Accordingly, it would be desirable to provide methods, devices and systems which address these, and other, challenges.

BRIEF DESCRIPTION OF THE DRAWINGS

The above and other objects and features of the embodiments will become apparent and more readily appreciated from the following description of the embodiments with reference to the following figures, wherein like reference numerals refer to like parts throughout the various figures unless otherwise specified, and wherein.

SUMMARY

An aspect of the embodiments is to substantially solve at least one or more of the problems and/or disadvantages discussed above, and to provide at least one or more of the advantages described below.

It is therefore a general aspect of the embodiments to provide a voltage mode transmitter assembly that will obviate or minimize problems of the type previously described.

According to a first aspect of the embodiments, a passive, voltage mode transmitter assembly is provided comprising a baseband filter configured to filter a source baseband signal, a passive, voltage mode mixer, connected to the harmonics filter, configured to up-convert the filtered, source baseband signal to a radio signal, a harmonics filter, connected between the baseband filter and the passive, voltage mode mixer, configured to remove harmonics from the radio signal, and a power amplifier, connected to the passive, voltage mode mixer, configured to amplify the radio signal.

According to a second aspect of the embodiments, a method for transmitting a radio signal in a passive voltage mode transmitter assembly includes the steps of performing an initial filtering of a source baseband signal using a baseband filter, up-converting the filtered source baseband signal using a passive, voltage mode mixer to generate a radio signal, performing a further filtering, using a harmonics filter connected between the baseband filter and the passive, voltage mode mixer, to remove harmonics from the radio signal, and amplifying the radio signal.

These, and other, embodiments are described in more detail below. Among other things, such embodiments enable a reduction in third and/or fifth order harmonic intermodulation products without significantly increasing the power consumption and/or complexity of the transmit circuitry.

DETAILED DESCRIPTION

The following detailed description of the exemplary embodiments refers to the accompanying drawings. The same reference numbers in different drawings identify the same or similar elements. Also, the following detailed description does not limit the invention.

Reference throughout the specification to "one embodiment" or "an embodiment" means that a particular feature, structure, or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics described herein may be combined in any suitable manner in one or more embodiments.

Figure 1A:
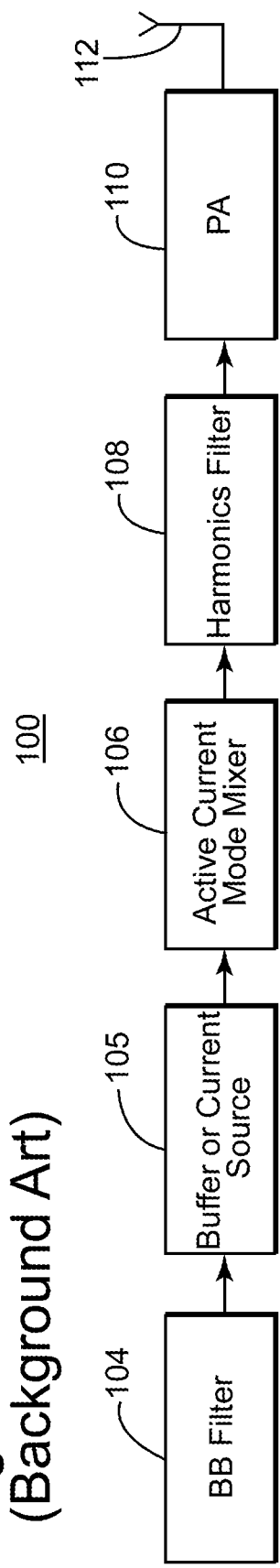
FIG. 1A illustrates a conventional simple, active, current mode, sampling mixer circuit.
Figure 1B:
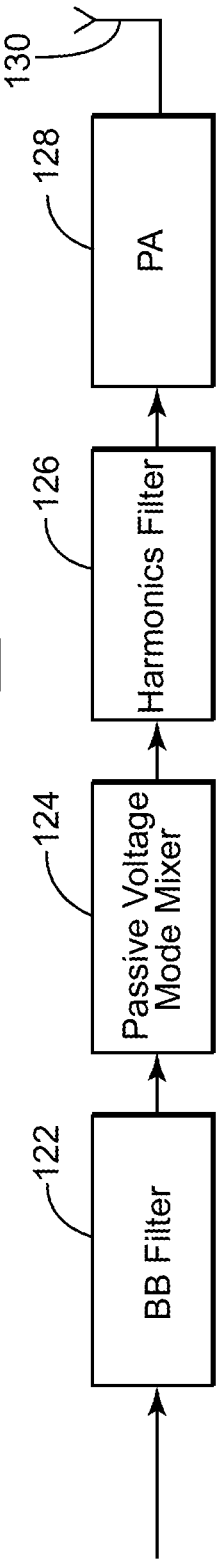
FIG. 1B illustrates a first conventional simple, passive, voltage mode, sampling mixer circuit.
Figure 1C:
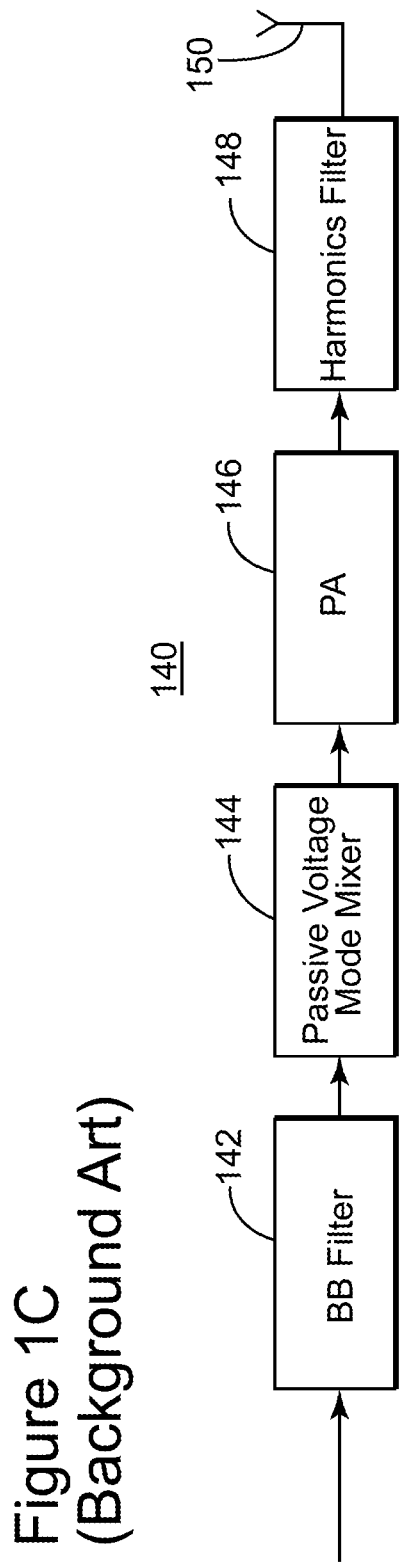
FIG. 1C illustrates a second conventional simple, passive, voltage mode, sampling mixer circuit.
Figure 2:
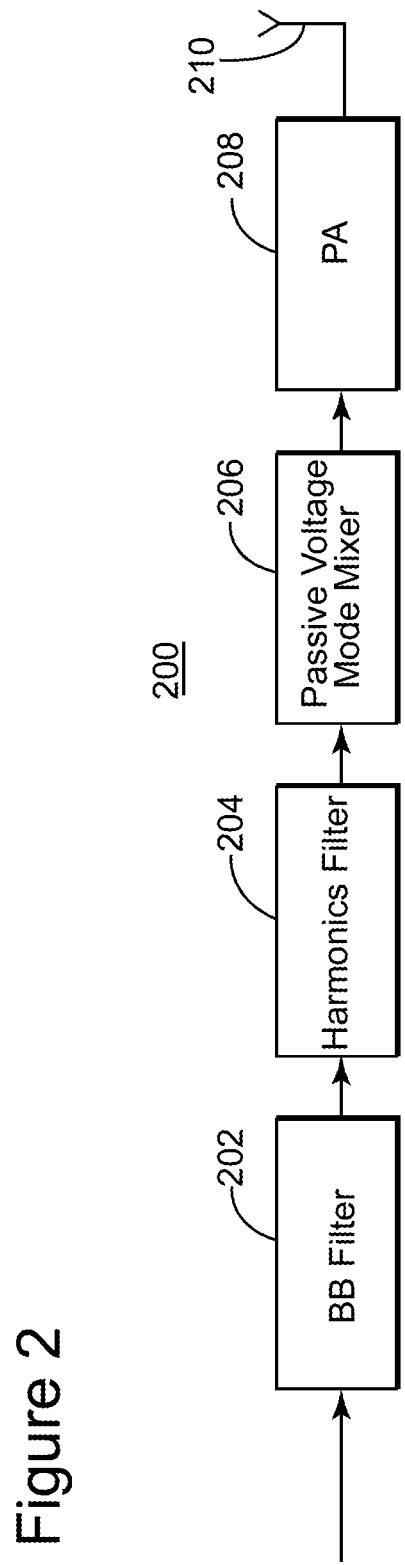
FIG. 2 illustrates a simple, passive, voltage mode, sampling mixer circuit according to an embodiment.
Figure 13A:
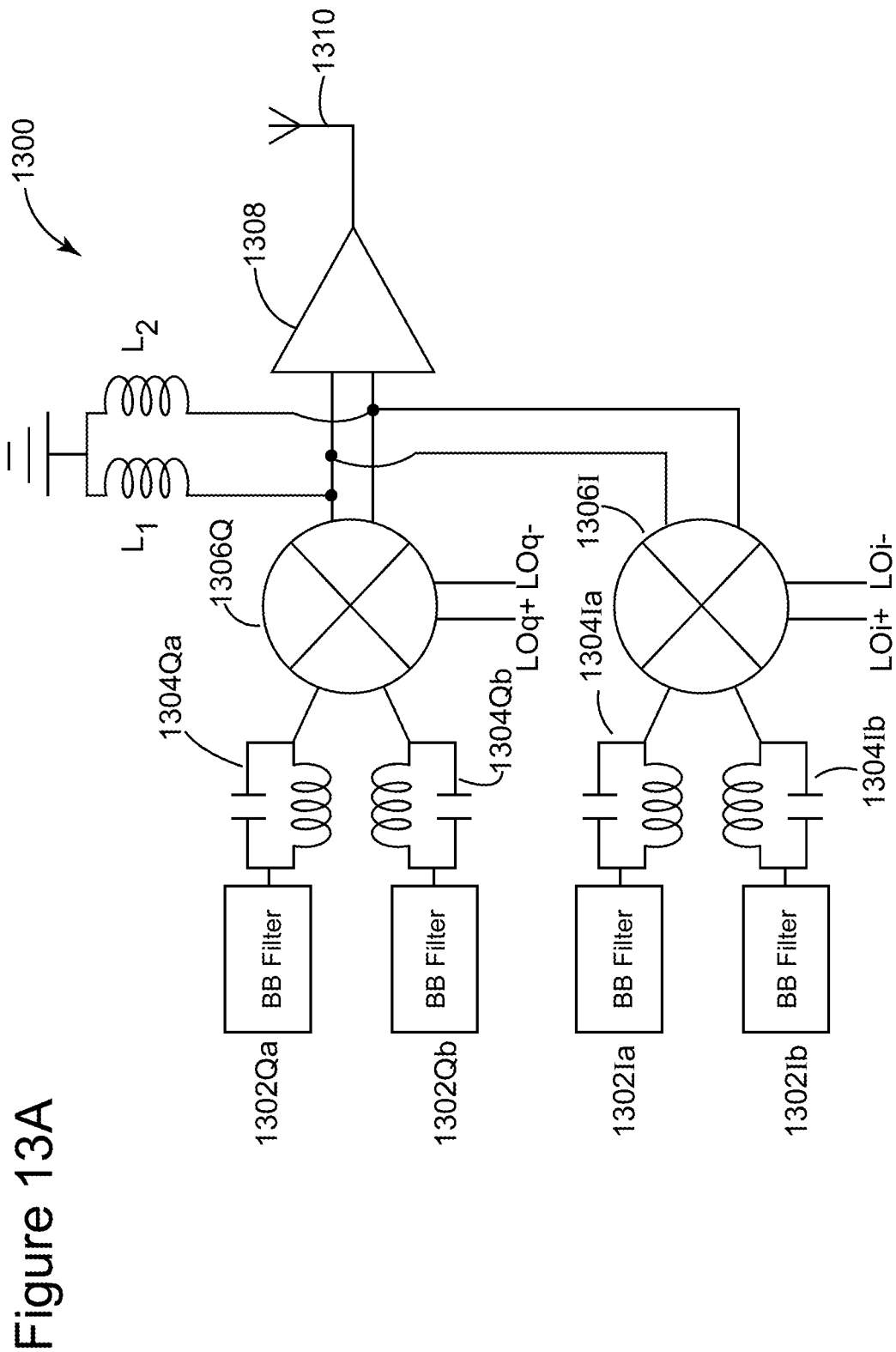
FIG. 13A illustrates a detailed component view of a complex, passive, voltage mode sampling mixer circuit according to a second alternate embodiment.

Attention is directed to FIG. 2, which illustrates simple, passive, voltage mode sampling (SPVM) mixer circuit 200 according to an embodiment. As mentioned above, there are certain challenges or problems associated with the handling of harmonics in simple, passive, voltage mode, sampling mixers (at least some of these problems also apply to complex mixers, albeit in a slightly different manner, several embodiments of which are discussed in greater detail below). According to embodiments described herein, these challenges or problems are addressed by, for example, increasing the source impedance, seen by the succeeding RF block in the transmit chain, at one or more the harmonic frequencies of the carrier frequency of the radio signal. This can be accomplished by, for example, inserting harmonics filter 204 upstream of (i.e., before) mixer 206 in SPVM mixer circuit 200, as shown in FIG. 2 according to an embodiment. SPVM mixer circuit 200 shown in FIG. 2 further includes baseband filter 202, power amplifier 208, and antenna 210. By adding harmonics filter 204 prior to mixing in passive mixer 206 (from hereon in, all embodiments include passive mixers, as opposed to active mixers, the differences between which have been discussed above), the harmonic content of the up-converted baseband signal is substantially reduced to the succeeding stage, i.e., power amplifier 208, and is instead substantially distributed to the source itself. As briefly mentioned above, the affect at the harmonics filter of distributing harmonic content to the source impedance prior to amplification, applies to not only simple mixers as shown and described in regard to FIGS. 2, 4, and 5, but also to the complex mixers of FIGS. 9, 11, and 13, but with certain variations due to the increased complexity of the complex mixer circuits. However, as will become clear from the detailed discussion below, certain ones of the harmonic content are also substantially reduced prior to amplification in the complex mixer circuits of FIGS. 9, 11, and 13, for substantially similar reasons, i.e., distribution to a source impedance as seen by the amplifier.

Figure 3A:
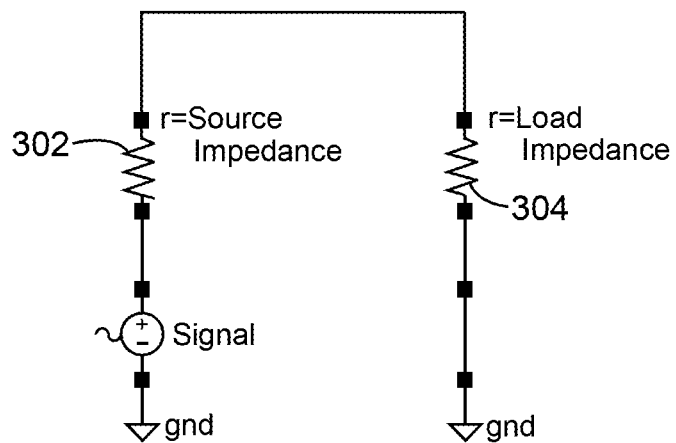
FIGS. 3A-C conceptually illustrate impedance transformation according to an embodiment.
Figure 3B:
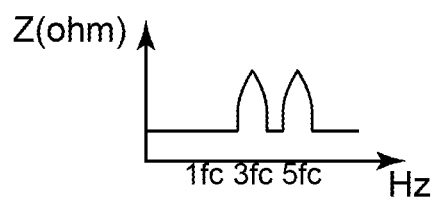
Figure 3C:
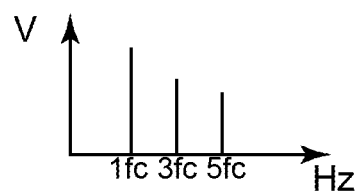

FIGS. 3A-C are simplified figures that describe the basic behavior of harmonics filter 204 according to these embodiments. FIG. 3A illustrates the impedance of the circuit of FIG. 2 as seen from the perspective of power amplifier 208. That is, source impedance 302 represents the frequency dependent impedance of harmonics filter 204, BB filter 202, and mixer 206, as seen by power amplifier 208, and load impedance 304 represents the frequency dependent impedance of antenna 210. Consequently, there are impedance spikes around the third and fifth harmonics associated with the carrier frequency (see, FIG. 3B). In this way, the voltage at the harmonic frequencies (illustrated in FIG. 3C) is distributed over the source impedance instead of over load impedance 304.

Figure 4:
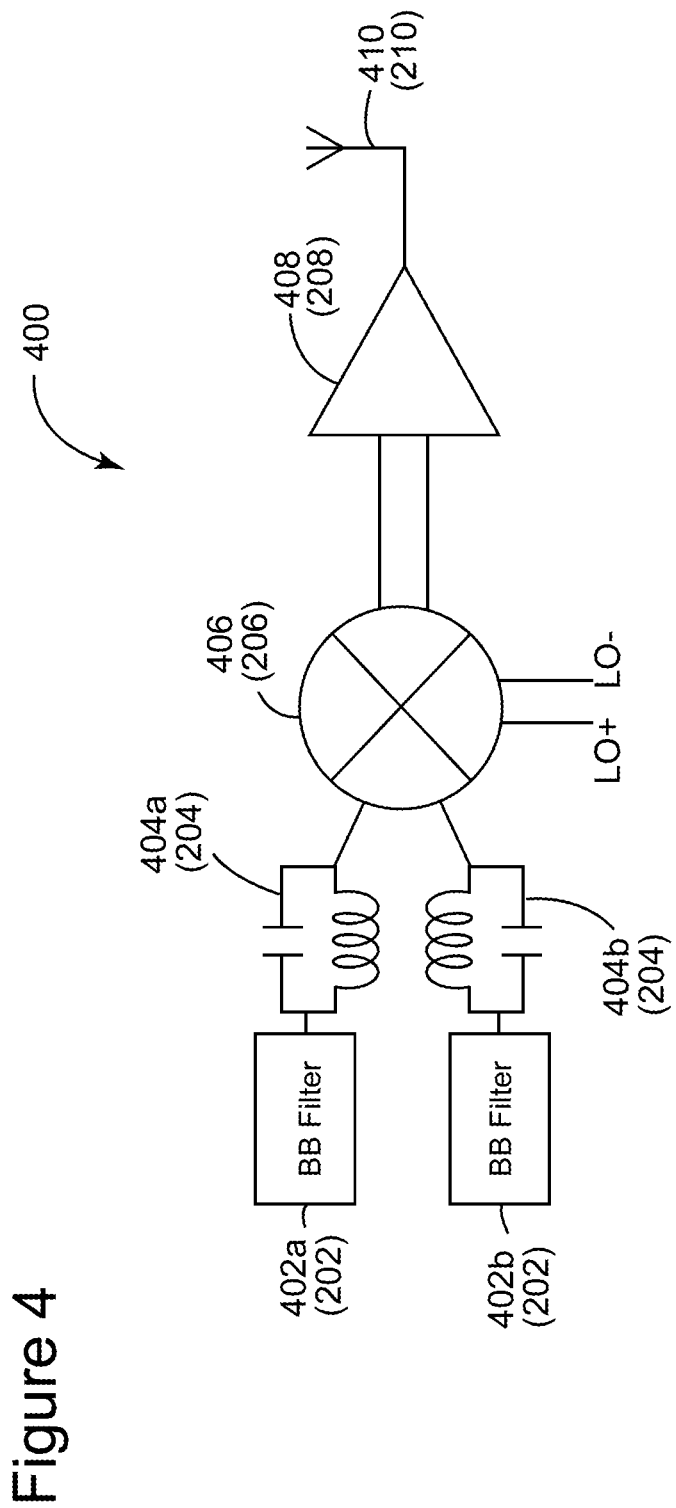
FIG. 4 illustrates a detailed component view of the simple, passive, voltage mode, sampling mixer circuit of FIG. 2.

FIG. 4 illustrates a detailed component view of SPVM mixer circuit 200 of FIG. 2, which, in its components form, is now referenced as simple, passive, voltage mode sampling (SPVM) mixer circuit 400 according to an embodiment. Note that the devices of FIG. 4 are similarly referenced as, but not exactly as, the respective components of FIG. 2. That is, BB filter 202 of FIG. 2 has, as its corollary in FIG. 4, BB filter 402a and BB filter 402b (which corresponds to the differential inputs to the circuit 400), and so on. Therein, each of parallel resonator LC circuits (harmonics filter) 404a,b are respectively placed in series with its source, represented in this example by analog, BB filter 402a,b, respectively, for each of the differential inputs of the transmit chain, and upstream of mixer 406. Harmonics filter 404 has, in this example, a resonance frequency of about four times the carrier frequency of the RF signal. This configuration and placement of harmonics filter 404 increases, or transforms, the impedance seen by the power amplifier 408, at about three and at about five times the carrier frequency. This has the effect of lowering the voltage transfer function for the third and fifth order harmonics, and therefore attenuates the harmful third-order and fifth-order harmonics. The benefits of SPVM mixer circuit 400 is preserved due to harmonics filter 404 being transparent at baseband frequencies, thereby not degrading the transfer function for frequencies between the baseband frequency and the carrier frequency. Power amplifier 408 amplifies the up-converted RF signal output from mixer 406. Note, however, that there is no current source or buffer associated with driving SPVM mixer circuit 400 in this embodiment.

Although the previous embodiment describes providing the parallel resonator circuit with a resonance frequency of about four times the carrier frequency of the radio signal, those skilled in the art will appreciate that other resonance values may be selected for this circuit element that will still have the capability to reduce the harmonics experienced downstream, e.g., a resonance frequency of between about 3.5 times and about 4.5 times the carrier frequency, depending upon, for example, the Q factor of the circuit. According to a further embodiment, the inductors of harmonic filters 404a,b can be configured as a single inductor assembly, with differential inputs and differential outputs as is known those of skill in the art. As can be further appreciated by those of skill in the art, such an arrangement provides a reduction in the surface area of a circuit board for the transmitter assembly, as a second separate inductor or coil is no longer needed, without any reduction in performance.

Figure 5:
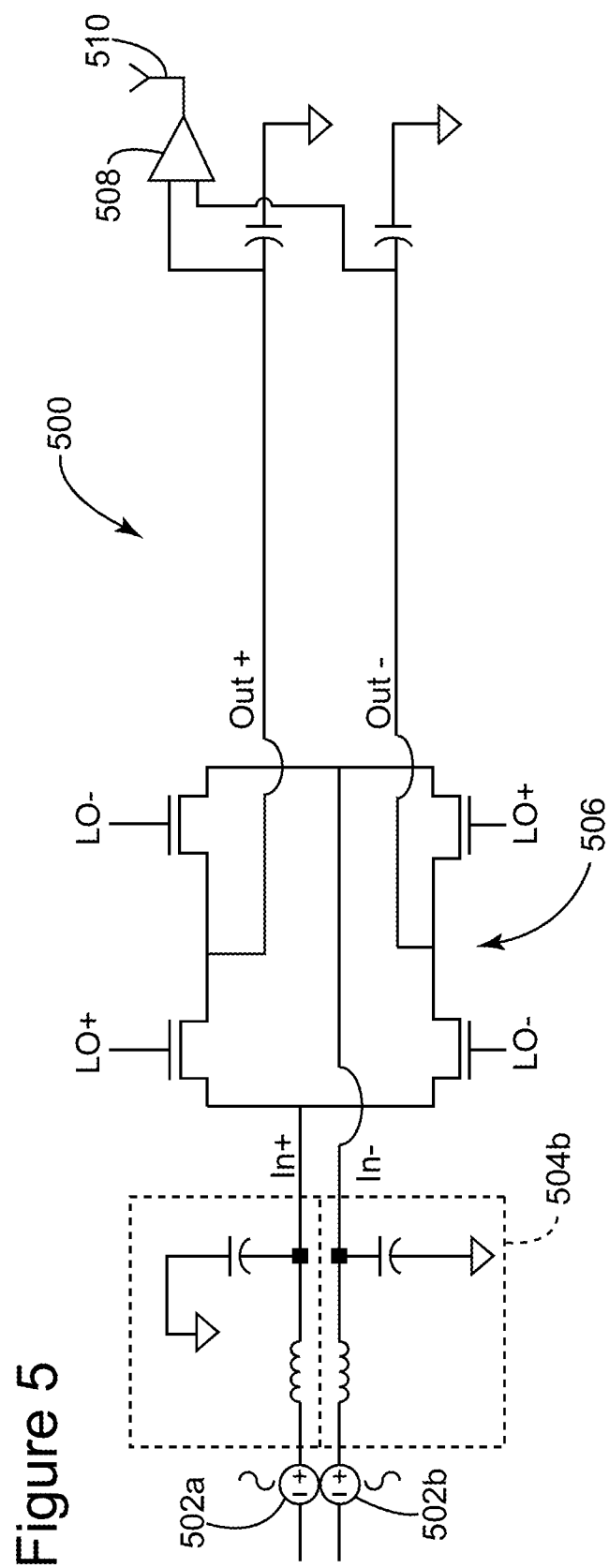
FIG. 5 illustrates a detailed component view of a simple, passive, voltage mode, sampling mixer circuit according to an alternate embodiment.

FIG. 5 illustrates a detailed component view of simple, passive, voltage mode sampling (SPVM) mixer circuit 500 according to an alternate embodiment. In functionality, SPVM mixer circuit 500 operates substantially similarly to SPVM mixer circuit 400, but with a different configuration of harmonics filter 504a,b versus that of harmonics filter 404a,b of FIG. 4. The same referencing convention has been applied with respect to FIG. 5 as was done in FIG. 4, in view of FIG. 2. Thus, SPVM mixer circuit mixer circuit 500 includes BB filters as inclusive of signal sources 502a,b, harmonics filters 504a,b, passive mixer 506, power amplifier 508 (in this case, a dual input, i.e., complementary or differential input, amplifier), and antenna 510.

As discussed above, in operation, SPVM mixer circuit 500 according to an embodiment operates substantially similar to that of SPVM mixer circuit 400. That is, harmonics filter 404 has a resonance frequency of about four times the carrier frequency of the RF signal. This configuration and placement of harmonics filter 504 increases or transforms the impedance seen by the succeeding RF block, i.e., mixer 506, at both about three and about five times the carrier frequency. This lowers the voltage transfer function for those harmonics, attenuating the harmful third-order and fifth order harmonics. The benefits of SPVM mixer circuit 500 are preserved due to harmonics filter 504 being transparent at baseband frequencies, thereby not degrading the transfer function of frequencies from the baseband frequency to the carrier frequency.

Also shown in FIG. 5 is power amplifier 508 that amplifies the up-converted RF signal output from mixer 506. Note, however, that there is no current source or buffer associated with driving SPVM mixer circuit 500 in this embodiment. Still further, those of skill in the art can appreciate that though an example of the shunt resonator circuit of harmonics filter 504 has a resonance frequency of about four times the carrier frequency of the radio signal, other resonance values can be selected for this circuit element that will still have the capability to reduce the harmonics experienced downstream, e.g., a resonance frequency of between about 3.5 times and about 4.5 times the carrier frequency, depending upon, for example, the Q factor of the circuit.

According to a further embodiment, the inductors of harmonic filters 504a,b can also be configured as a single inductor assembly, similarly to that of harmonic filters 404a,b, with differential inputs and differential outputs as is known those of skill in the art. As can be further appreciated by those of skill in the art, such an arrangement provides a reduction in the surface area of a circuit board for the transmitter assembly, as a second separate inductor or coil is no longer needed, without any reduction in performance.

Figure 6:
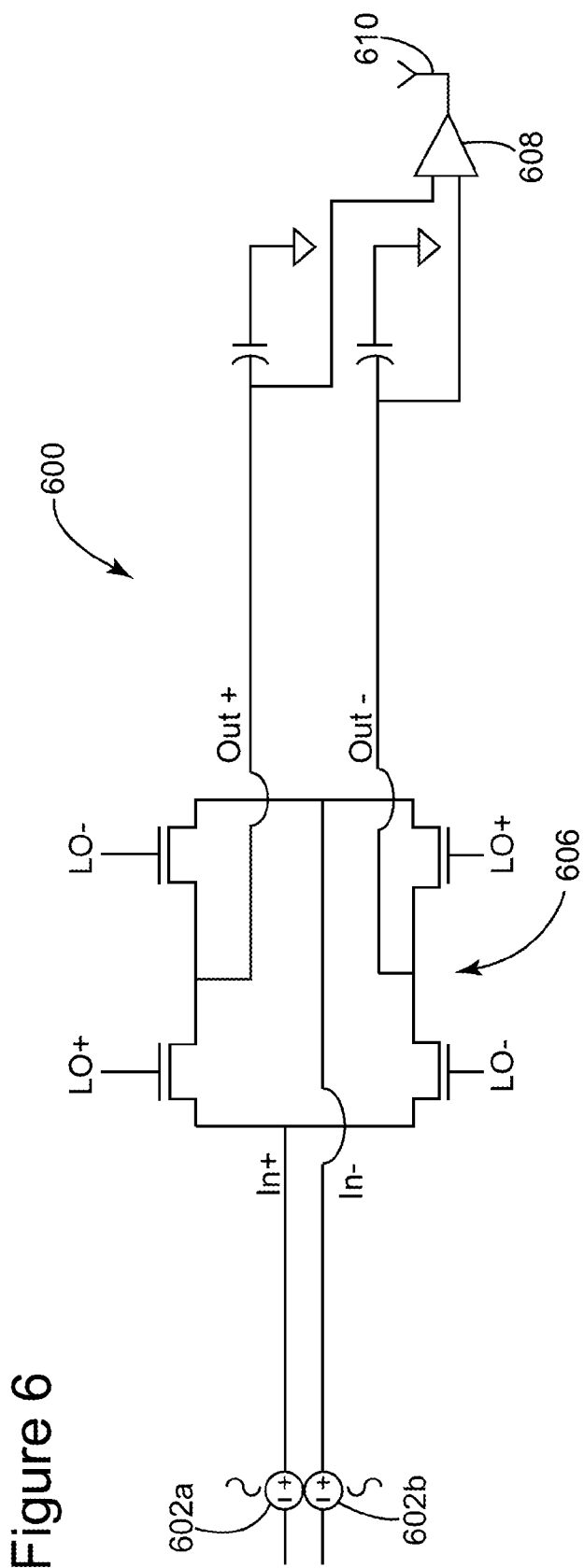
FIG. 6 illustrates a conventional simple, passive, voltage mode, sampling mixer circuit.

For comparative purposes, FIG. 6 illustrates a conventional passive, voltage mode, sampling (SPVM) mixer circuit 600 but without harmonics filters 504, and thus includes BB filters as inclusive of signal sources 602a,b, mixer 606, power amplifier 608 (in this case, a dual input amplifier, for differential input signals), and antenna 610.

Figure 7:
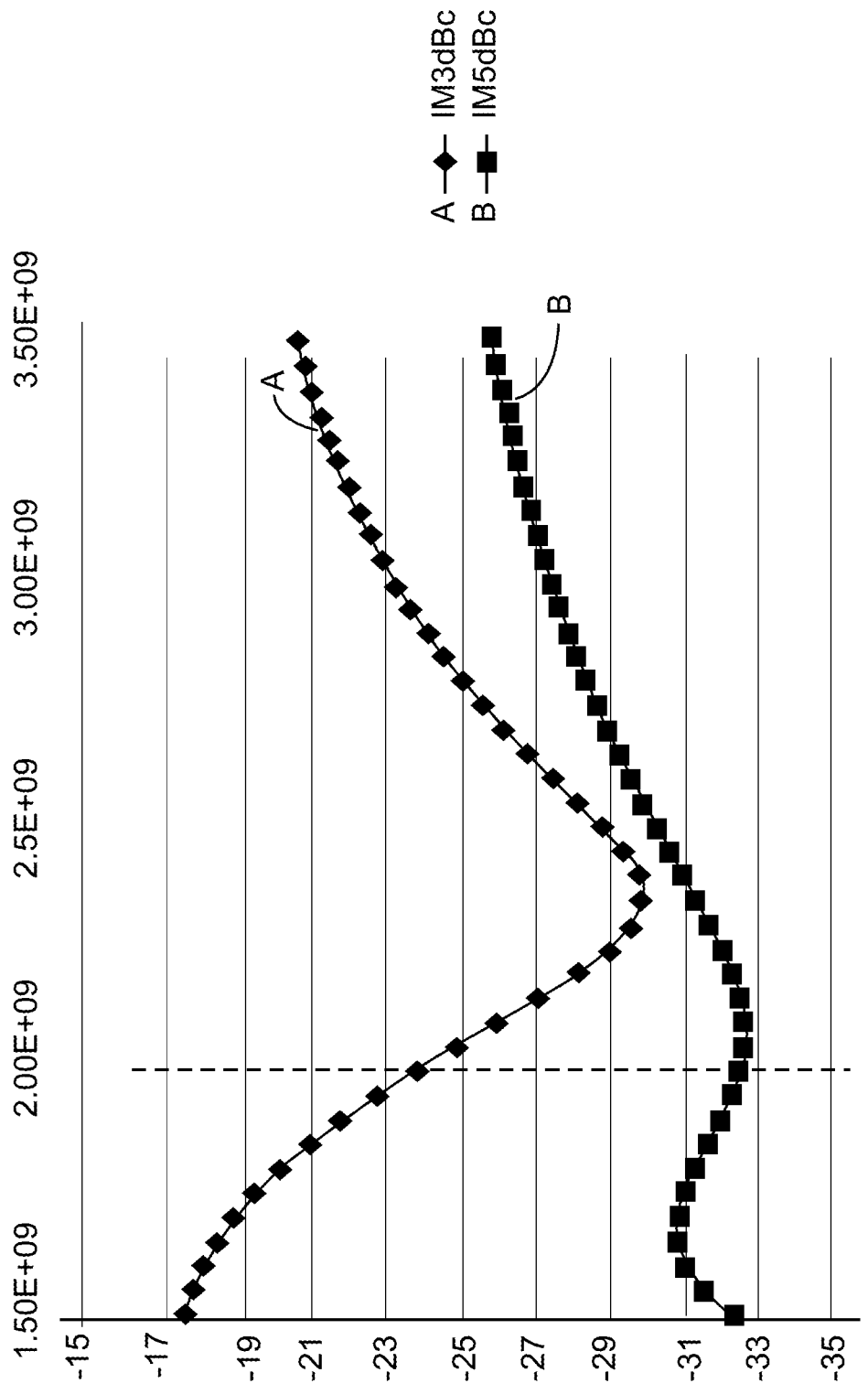
FIG. 7 illustrates simulation results showing a frequency response of the simple, passive, voltage mode, sampling mixer circuit of FIG. 4.

FIG. 7 illustrates simulation results showing a frequency response of SPVM mixer circuit 400 of FIG. 4 according to an embodiment. FIG. 7 illustrates amplitudes of certain harmonic signals of the LO signal versus the LO frequency, which, in this simulation, was swept from about 1½ GHz to about 3½ GHz, wherein the LO frequency is about 2 GHz, shown by a vertical dashed line. Line A represents the relative amplitude of the third harmonic of the LO as it was swept from about 1½ to about 3½ GHz in SPVM mixer circuit 400, with the inputs grounded (which is the common test set-up for all of the simulation results discussed herein). The third harmonic of the LO signal when using SPVM mixer circuit 400 (Line A) exhibits a substantive reduction at the LO signal of about 2 GHz, which would be the designed carrier frequency for certain applications. There is about a 10-11 dB loss in the relative amplitude of the third harmonic from its value when the LO is about 1½ GHz to when the LO is at about 2 GHz. The results for the fifth harmonic signal, line B, are fairly good as well: the relative amplitude at about 2 GHz is about −32 dB. Further, it can be appreciated by those of skill in the art that neither the third harmonic greatest attenuation point nor the fifth harmonic greatest attenuation point are at the same frequency, nor exactly at the 2 GHz LO signal frequency, thought the greatest attenuation point of the fifth harmonic is fairly close the 2 GHz LO signal. Those of skill in the art can readily appreciate that at such high frequencies, stray capacitances will have effects on resonance values of filters especially. In this case, there is stray capacitance associated with the mixers and the effect of stray capacitance changes as a function of frequency, which is readily apparent to those of skill in the art. Nonetheless, there are advantages of including harmonic filters 404a,b in the circuit of FIG. 4, though in other configurations, results are much more impressive.

Figure 8:
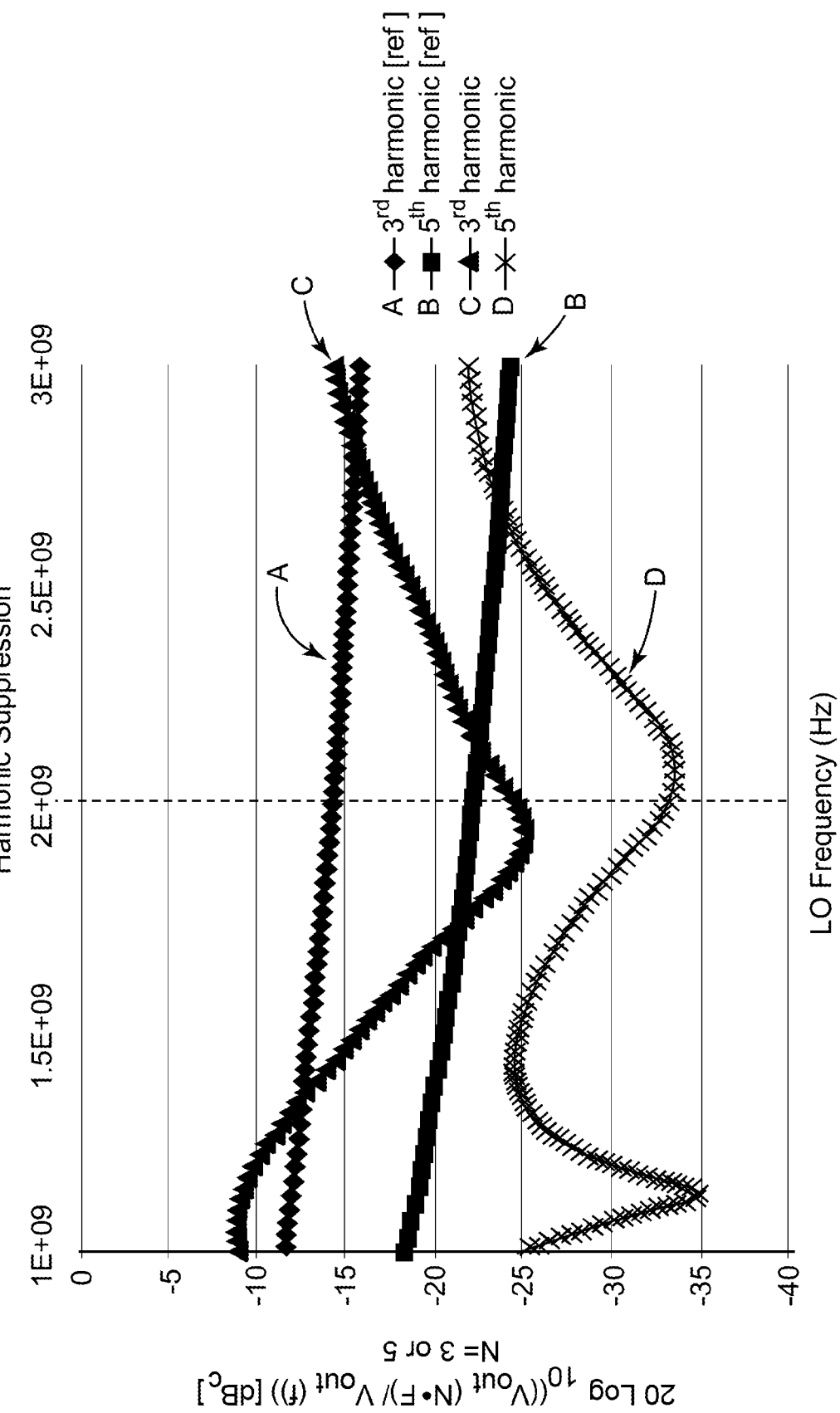
FIG. 8 illustrates simulation results showing frequency responses of both the simple, passive, voltage mode, sampling mixer circuit of FIG. 5, and the conventional simple, passive, voltage mode, sampling mixer circuit shown in FIG. 6.

FIG. 8 illustrates simulation results showing frequency responses of both SPVM mixer circuit 500 of FIG. 5 according to an embodiment, and conventional SPVM mixer circuit 600 shown in FIG. 6. As with FIG. 7, FIG. 8 illustrates amplitudes of certain harmonic signals of the LO signal versus the LO frequency, which, in this simulation, was swept from about 1 GHz to about 3 GHz, wherein the LO frequency is about 2 GHz. Line A represents the relative amplitude of the third harmonic of the LO as it was swept from about 1 to about 3 GHz in SPVM mixer circuit 600. The amplitude of the third harmonic in this case fairly monotonically decreases over the swept frequency range of the LO. Similarly, the relative amplitude of the fifth harmonic signal, line B, also fairly monotonically decreases over the swept frequency range. However, in marked contrast, the third harmonic of the LO signal when using SPVM mixer circuit 500 (Line C) exhibits a substantive reduction at the LO signal of about 2 GHz, which would be the designed carrier frequency for certain applications. There is about a 15 dB loss in the relative amplitude of the third harmonic from its value when the LO is about 1 GHz to when the LO is at about 2 GHz. More significantly, there is just over a −10 dB difference between the relative amplitudes of the third harmonic in SPVM mixer circuit 600 and SPVM mixer circuit 500 according to an embodiment, meaning that SPVM mixer circuit 500 provides a significant reduction of third harmonic signal levels. A similar result is available and readily seen in regard to the fifth harmonic signal, line D. Again there is about a −10 dB difference between the relative amplitudes of the fifth harmonic in SPVM mixer circuit 600 and SPVM mixer circuit 500 according to an embodiment, meaning that SPVM mixer circuit 500 provides a significant reduction of fifth harmonic signal levels.

Note, though, that neither the third harmonic greatest attenuation point nor the fifth harmonic greatest attenuation points are at the same frequency, nor exactly at the 2 GHz LO signal frequency. Those of skill in the art can readily appreciate that at such high frequencies, stray capacitances will have effects on resonance values of filters especially. In this case, there is stray capacitance associated with the mixers, and the effect of stray capacitance changes as a function of frequency, which is readily apparent to those of skill in the art. Nonetheless, the advantages of including harmonic filters 504a,b are such that said minor deviations from designed operating points are well tolerated, and can be afforded within the overall system constraints.

Figure 9:
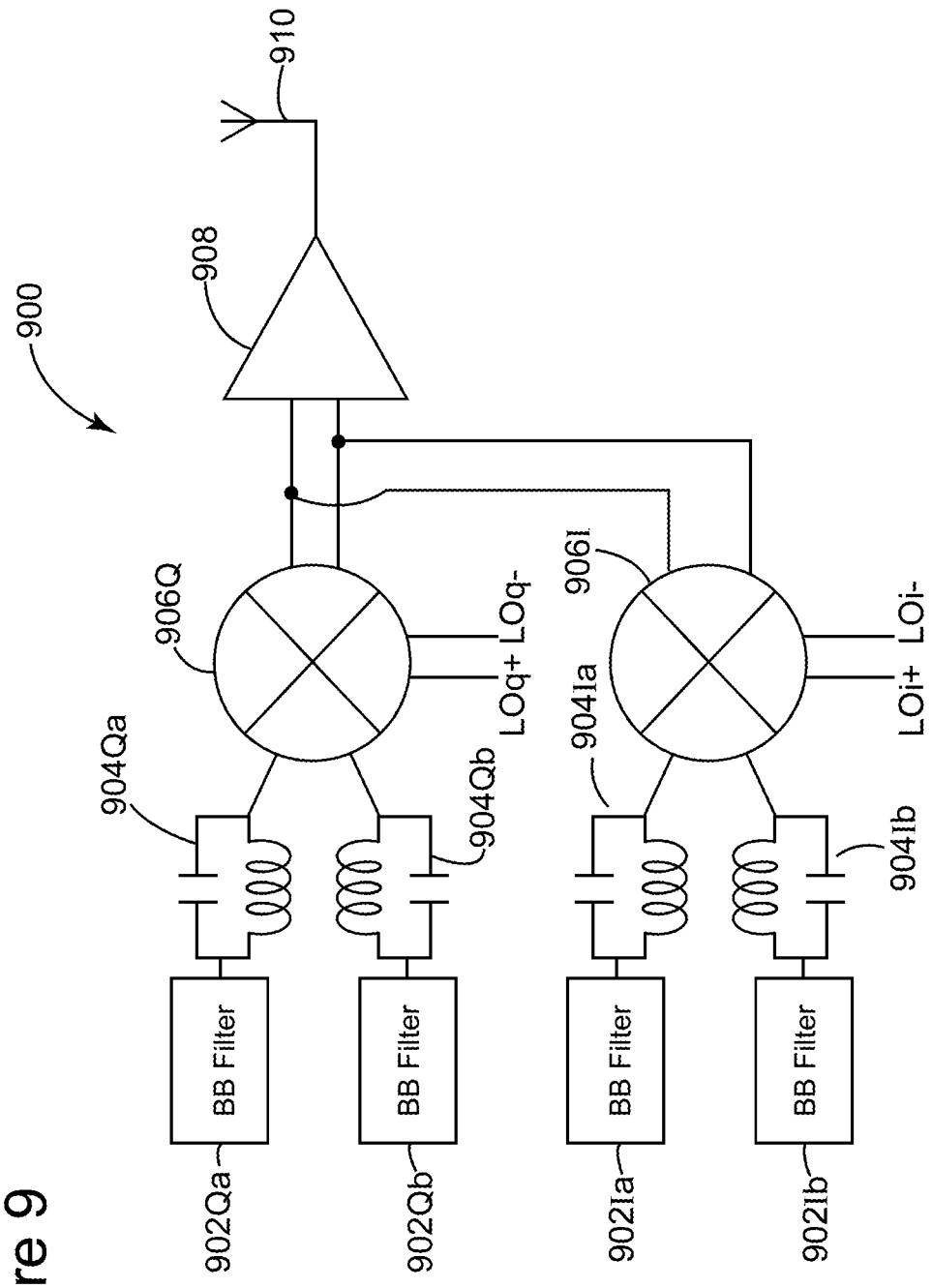
FIG. 9 illustrates a detailed component view of a complex, passive, voltage mode sampling mixer circuit according to an embodiment.

FIG. 9 illustrates a detailed component view of complex, passive, voltage mode sampling (CPVM) mixer circuit 900 according to an embodiment. CPVM mixer circuit 900 includes Q channel complementary inputs/baseband filters 902Qa and 902Qb, harmonics filters 904Qa and 904Qb, and mixer 906Q. The local oscillator signals input to mixer 906Q are LOq+ and LOq−. A substantially similar arrangement is present for the I channel: I channel complementary inputs/baseband filters 902Ia and 902Ib, harmonics filters 904Ia, and 904Ib, and mixer 906I. The local oscillator signals input to mixer 906I are LOi+ and LOi−. The dual outputs of mixers 906Q and 906I are wired in parallel and connected to power amplifier 908, the output of which is connected to transmit antenna 910. Those of skill in the art can appreciate that antenna 910 (as well as all of the other antennas shown and described) could also be a receive antenna, and an appropriately located isolator could be located on the output of power amplifier 908 to prevent signals from being fed into its output.

It will be apparent to those of skill in the art that FIG. 9 is a complex embodiment of the simple mixer of FIG. 4; however, upon placing two mixers in parallel in CPVM mixer circuit 900, performance degrades due to the influence of the input impedance of the two mixers in parallel. Further, it should be understood that when using complex mixers of the sort of FIGS. 9-11, the modulation of the two channels, I and Q cannot overlap in time; that is, when mixing is occurring with regard to the I channel, it cannot occur in regard to the Q channel; therefore, a duty cycle limit of 25% is imposed according to an embodiment for each of LOq and LOi. According to an embodiment, either of the Q or I channels will be allowed to mix during a first 25% of the time, then a rest period of 25%, then the other channel will be mixed, and then another rest period of 25%, and this repeats as needed.

Figure 10:
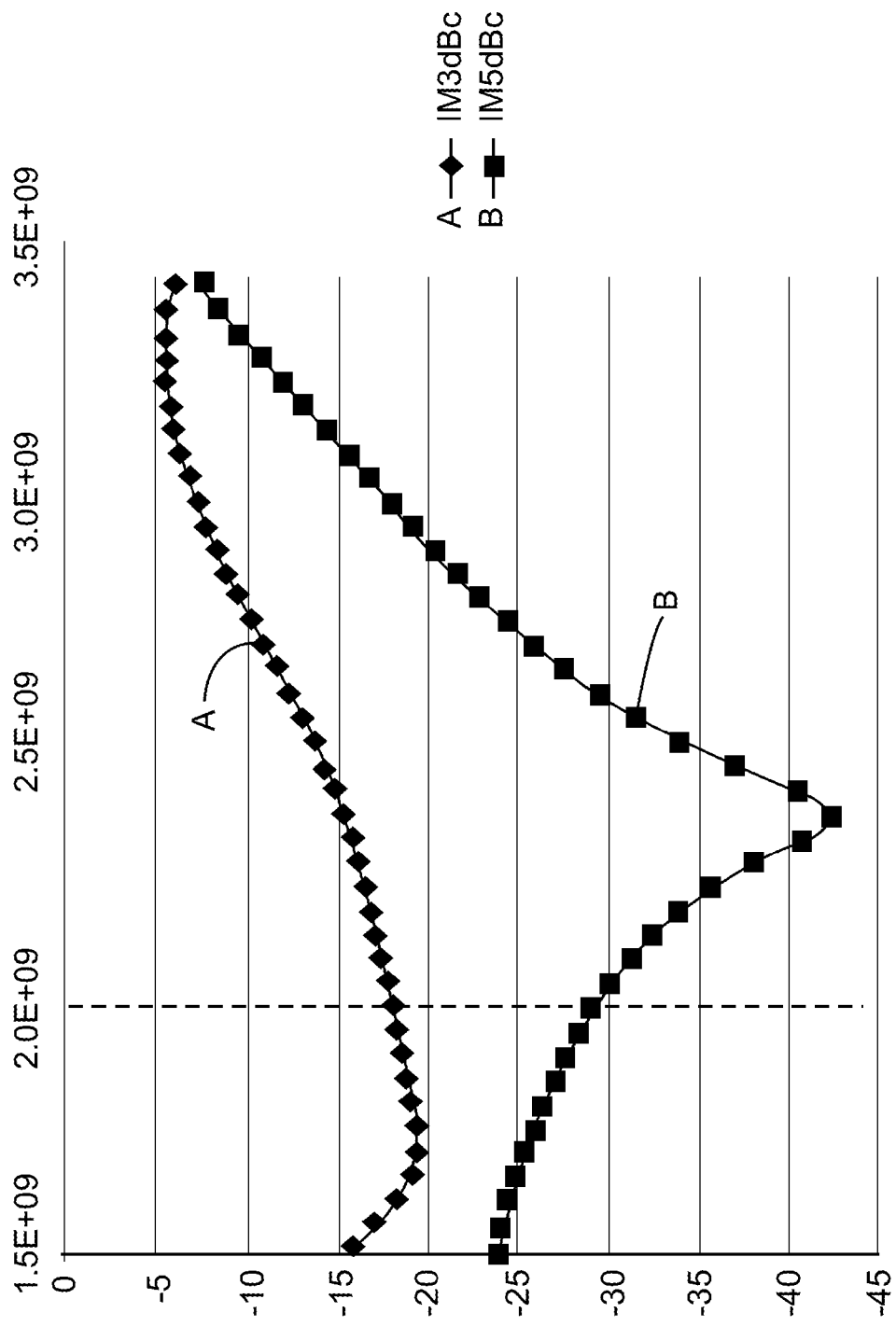
FIG. 10 illustrates simulation results showing a frequency response of the complex, passive, voltage mode sampling mixer circuit of FIG. 9.

FIG. 10 illustrates simulation results showing a frequency response of CPVM mixer circuit 900 of FIG. 9. Because SPVM mixer circuit 400 and CPVM mixer circuit 900 are very similar, a comparison can be made of their simulated frequency response of both third and fifth harmonic signal levels, i.e., comparison of FIG. 10 (CPVM mixer circuit 900 simulation, and FIG. 7, SPVM mixer circuit 400). FIG. 10 illustrates amplitudes of certain harmonic signals of the LO signal versus the LO frequency, which, in this simulation, was swept from about 1½ GHz to about 3½ GHz, wherein the LO frequency is normally, in operation, about 2 GHz. Line A represents the relative amplitude of the third harmonic of the LO as it was swept from about 1½ to about 3½ GHz in CPVM mixer circuit 900. The third harmonic of the LO signal when using CPVM mixer circuit 900 (Line A) exhibits a fairly monotonic rise following a small, short, initial dip in the frequency response. This is not a desirable frequency response for a third harmonic of the LO, especially when compared to the third harmonic response of FIG. 7; there, the third harmonic dips appreciably at or about 2 GHz, and in FIG. 10, the third harmonic level is steadily rising from only a low of about −20 dB at just past 1.6 or 1.7 GHz, till it levels off at about −5 dB at about 3.3 or 3.4 GHz. The fifth harmonic, line B, shows a very sharp dip at about 2.5 GHz, dropping from about −25 dB at about 1.5 GHz to about −40+dB at about 2.5 GHz. From there, the fifth harmonic steadily increases, until it reaches about −8 dB at about 3.5 GHz. The first part of the fifth harmonic response of FIG. 10 is markedly different than the first half of the fifth harmonic response as shown in FIG. 7 (SPVM mixer circuit 400), but the second half (after about 2.5 GHz) of the fifth harmonic response shown in FIG. 7 is markedly than that of CPVM mixer circuit 900. Further, the fifth harmonic greatest attenuation point of FIG. 10 (CPVM mixer circuit 900) is not exactly at the 2 GHz LO signal frequency. Those of skill in the art can readily appreciate that at such high frequencies, stray capacitances will have effects on resonance values of filters especially. In this case, there is stray capacitance associated with the mixers and the effect of stray capacitance changes as a function of frequency, which is readily apparent to those of skill in the art.

Figure 11:
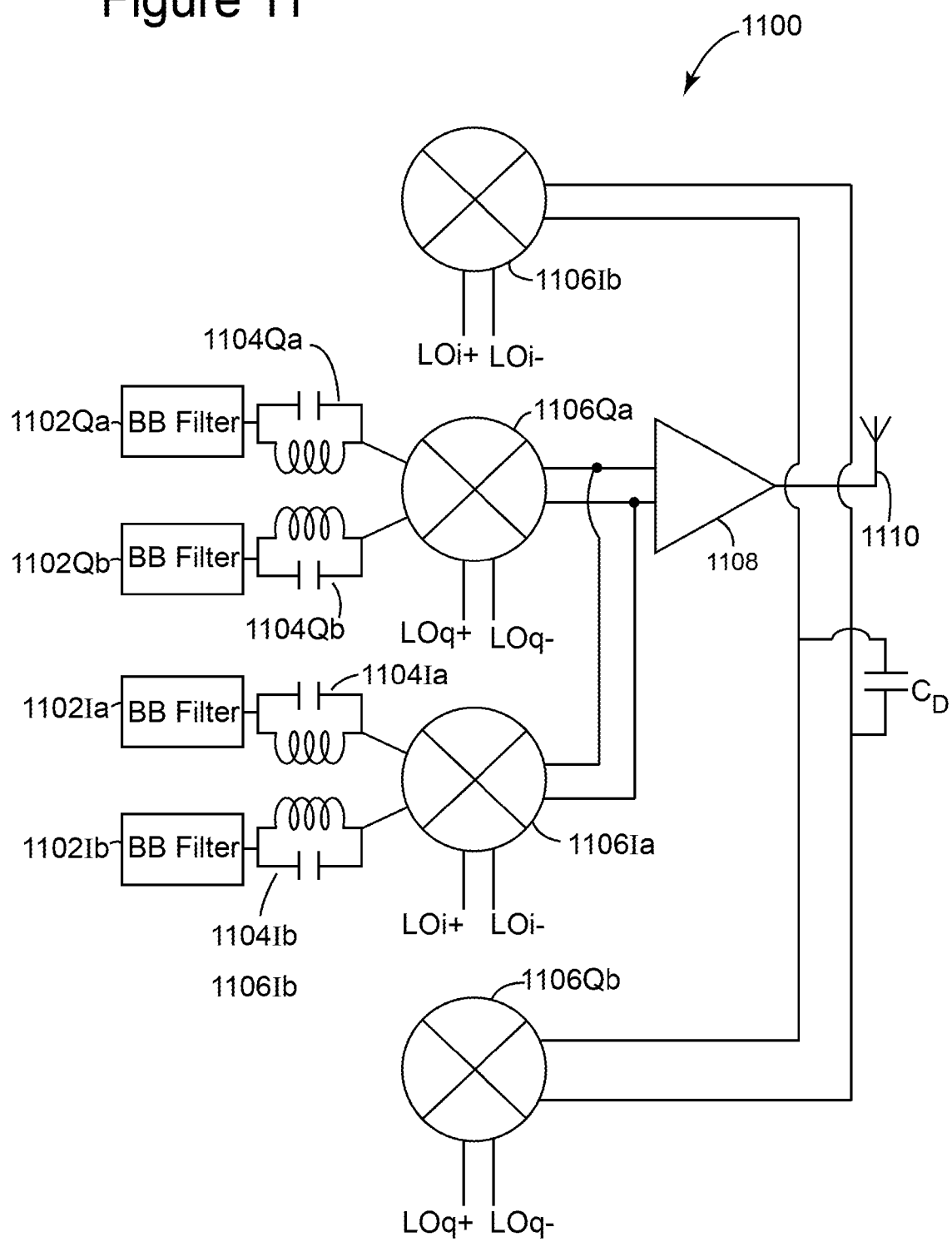
FIG. 11 illustrates a detailed component view of a complex, passive, voltage mode sampling mixer circuit according to a first alternate embodiment.
Figure 12:
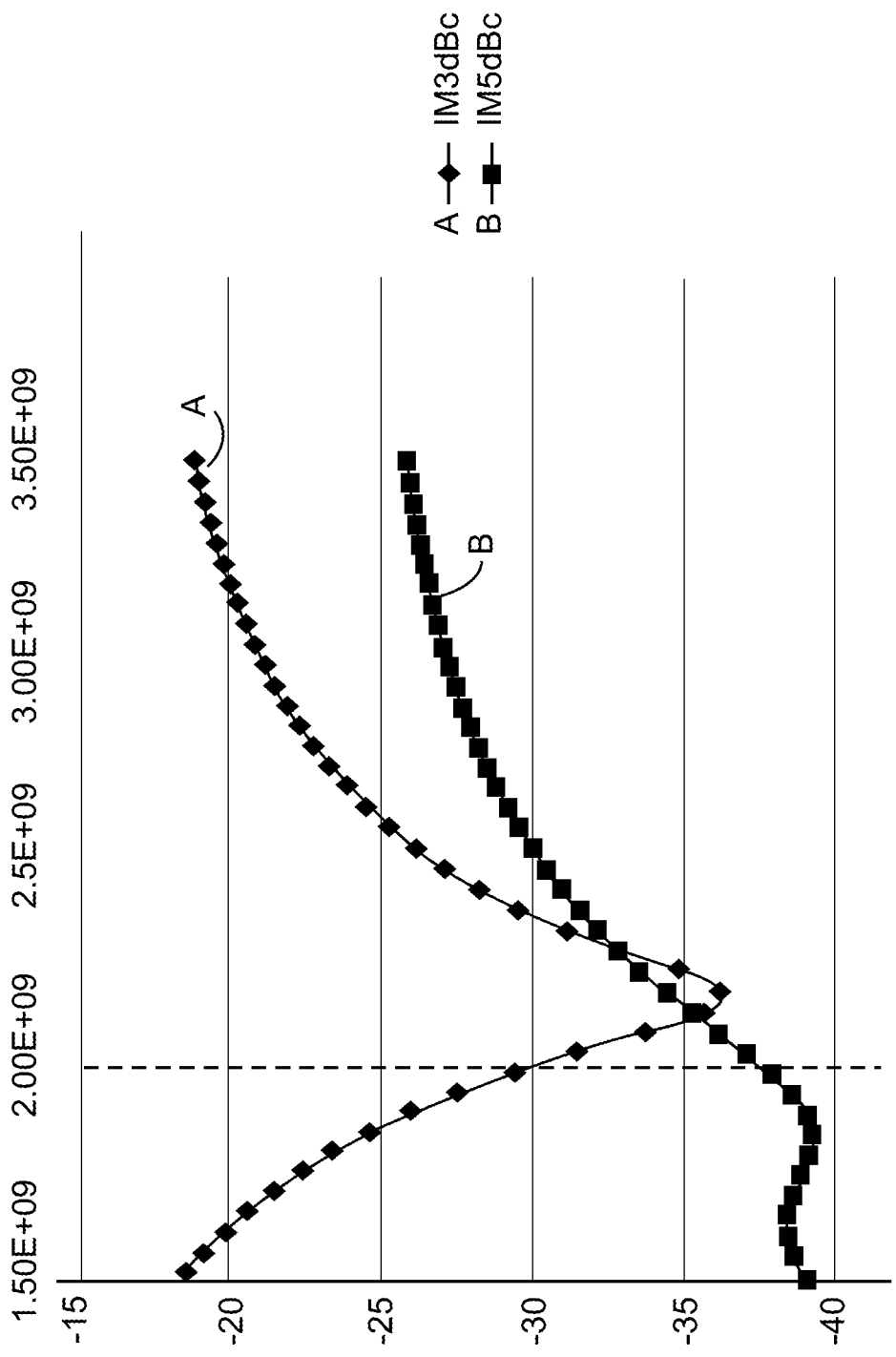
FIG. 12 illustrates simulation results showing a frequency response of the complex, passive, voltage mode sampling mixer circuit of FIG. 11.

FIG. 11 illustrates a detailed component view of complex, passive, voltage mode sampling (CVPM) mixer circuit 1100 according to a first alternate embodiment, and FIG. 12 illustrates simulation results showing a frequency response of CPVM mixer circuit 1100 of FIG. 11. CPVM mixer circuit 1100 includes Q channel complementary inputs/baseband filters 1102Qa and 1102Qb, harmonics filters 1104Qa and 1104Qb, and mixer 1106Qa. The local oscillator signals input to mixer 1106Qa are LOq+ and LOq−. However, there is also a dummy mixer on the Q channel, mixer 1106Ib (and one for the I channel, 1106Qb). While mixer 1106Ib receives as inputs the outputs of the Q channel BB filters 1102Qa,b through harmonics filters 1104Qa,b, its output is shunted into a dummy load, capacitor $C_D$, which represents the impedance of power amplifier 1108. There is a substantially similar arrangement for the I channel: I channel complementary inputs/baseband filters 1102Ia and 1102Ib, harmonics filters 1104Ia, and 1104Ib, and mixer 1106Ia, and dummy mixer 1106Qb. The dummy mixers 1106Ib and 1106Qb facilitate the development of a 50% duty cycle from two 25% duty cycle mixers. The local oscillator signals input to mixer 1106Ia are LOi+ and LOi−, while the LO inputs to dummy mixer 1106Qb are LOq+ and LOq−. The complementary outputs of mixers 1106Qa and 1106Ia are wired in parallel and connected to power amplifier 1108, the output of which is connected to transmit antenna 1110. Those of skill in the art can appreciate that antenna 1110 (as well as all of the other antennas shown and described) could also be a receive antenna, and an appropriately located isolator could be located on the output of power amplifier 1108 to prevent signals from being fed into its output.

As with CPVM mixer circuit 900 of FIG. 9, it should be understood that when using CPVM mixer circuit 1100, the modulation of the two channels, I and Q cannot overlap in time; that is, when mixing is occurring with regard to the I channel, it cannot occur simultaneously in the Q channel; therefore, a duty cycle limit of 25% is imposed according to an embodiment for each of LOq and LOi. According to an embodiment, either of the Q or I channels will be allowed to mix during a first 25% of the time, then a rest period of 25% will occur, then the other channel will be mixed, and then another rest period of 25%, and this repeats as needed.

FIG. 12 illustrates simulation results showing a frequency response of CPVM mixer circuit 1100 of FIG. 11. There are differences between CPVM mixer circuit 1100 and CPVM mixer circuit 900, in terms of performance and configuration, as discussed below. FIG. 12 illustrates amplitudes of certain harmonic signals of the LO signal versus the LO frequency, which, in this simulation, was swept from about 1½ GHz to about 3½ GHz, wherein the LO frequency is normally, in operation, about 2 GHz. Line A represents the relative amplitude of the third harmonic of the LO as it was swept from about 1½ to about 3½ GHz in CPVM mixer circuit 1100. The third harmonic of the LO signal when using CPVM mixer circuit 1100 (Line A) exhibits a fairly significant dip in relative amplitude; it drops from about −15 dB or so, at about 1½ GHz, to about −36 dB at about 2.2 to 2.3 GHz. From there, it rises in a curved manner, approaching its initial value of about −15 dB again at about 3½ GHz. Compared to FIG. 10, this is a substantial and meaningful improvement in the suppression of the third harmonic of the LO frequency according to an embodiment. Furthermore, there is also a substantial and meaningful improvement in the suppression of the fifth harmonic. The relative level of the fifth harmonic begins at about −39 dB at about 1½ GHz, remains relatively flat for about half a GHz or so, and then rises less dramatically than the relative amplitude of the fifth harmonic signal of CPVM mixer circuit 900 as shown in FIG. 10. In FIG. 12 it can be seen that from about 2 GHz to about 3½ GHz, the relative amplitude of the fifth harmonic rises from about −39 dB to about −25 dB.

Consider that at about 3½ GHz in the illustration of FIG. 10, the relative amplitude of the fifth harmonic of the LO was greater than −10 dB, there is almost a 15 dB gain in suppression for the fifth harmonic signal for CPVM mixer circuit 1100 versus that of CPVM mixer circuit 900.

Further, the fifth harmonic has a lowest attenuation point that is not exactly at the 2 GHz LO signal frequency, and the third harmonic lowest attenuation point is also not exactly at the 2 GHz LO signal frequency, and is also different from that of the lowest attenuation point of the fifth harmonic. Those of skill in the art can readily appreciate that at such high frequencies, stray capacitances will have effects on resonance values of filters especially. In this case, there is stray capacitance associated with the mixers and the effect of the stray capacitances also changes as a function of frequency, which is readily apparent to those of skill in the art.

As mentioned above, there are drawbacks to CPVM mixer circuit 1100. Such performance, as described above, and as those of skill in the art can appreciate, can come with a price. In this case, because CPVM mixer circuit 1100 includes two dummy mixers 1106Ib and 1106Qb, the price is in terms of extra components and power; CPVM mixer circuit 1100 does use more power than CPVM mixer circuit 900, and of course more power than SPVM mixer circuit 400. The buffers driving the I and Q LO signals (not shown) need to be doubled to provide the extra signals to the dummy mixers. Furthermore, the impedance seen by baseband filter is lowered by a factor of two, which increases the power consumption.

Figure 13B:
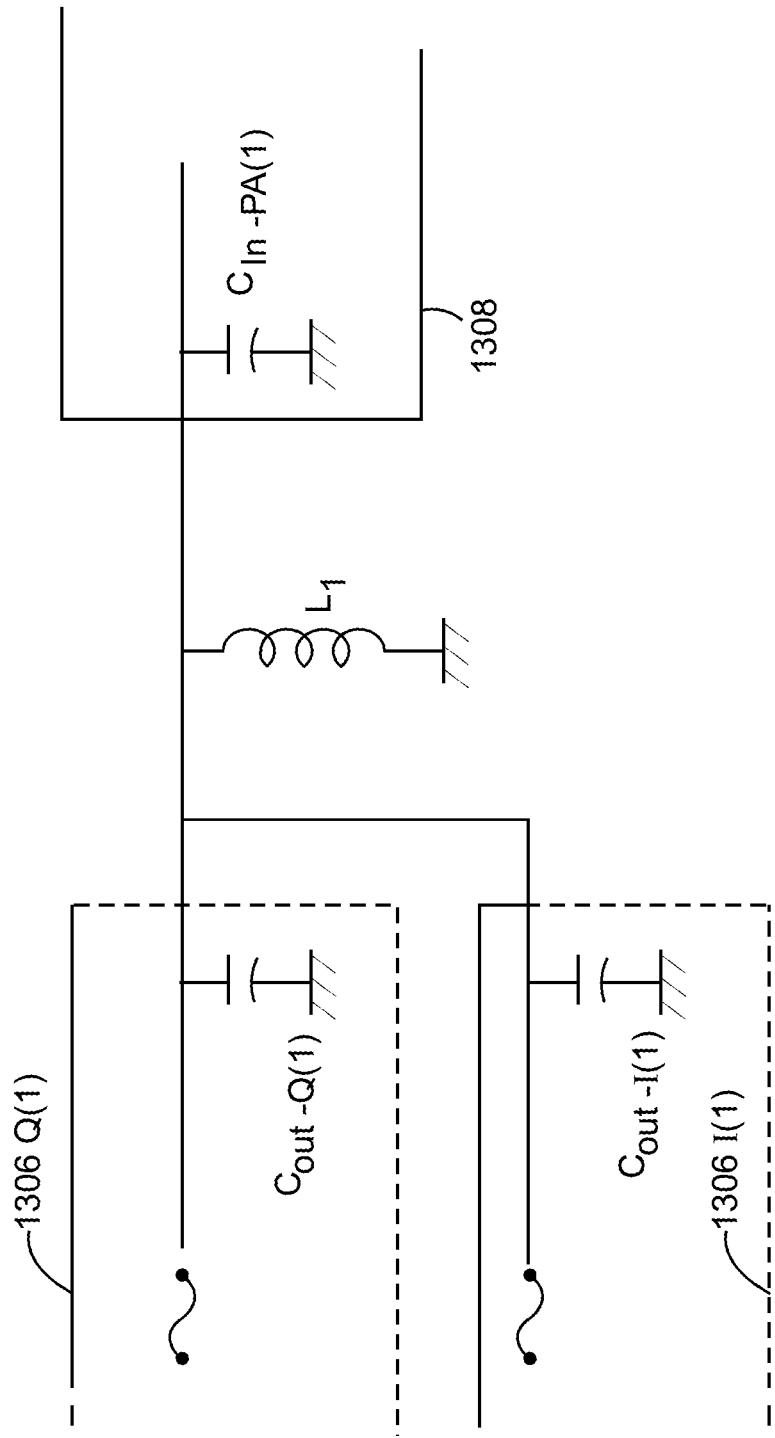
FIG. 13B illustrates a circuit model equivalent for the Q channel of the complex, passive voltage mode sampling mixer circuit of FIG. 13A between the output of the Q channel mixer and power amplifier constructed in the form of an LC tank circuit according to an embodiment.
Figure 14:
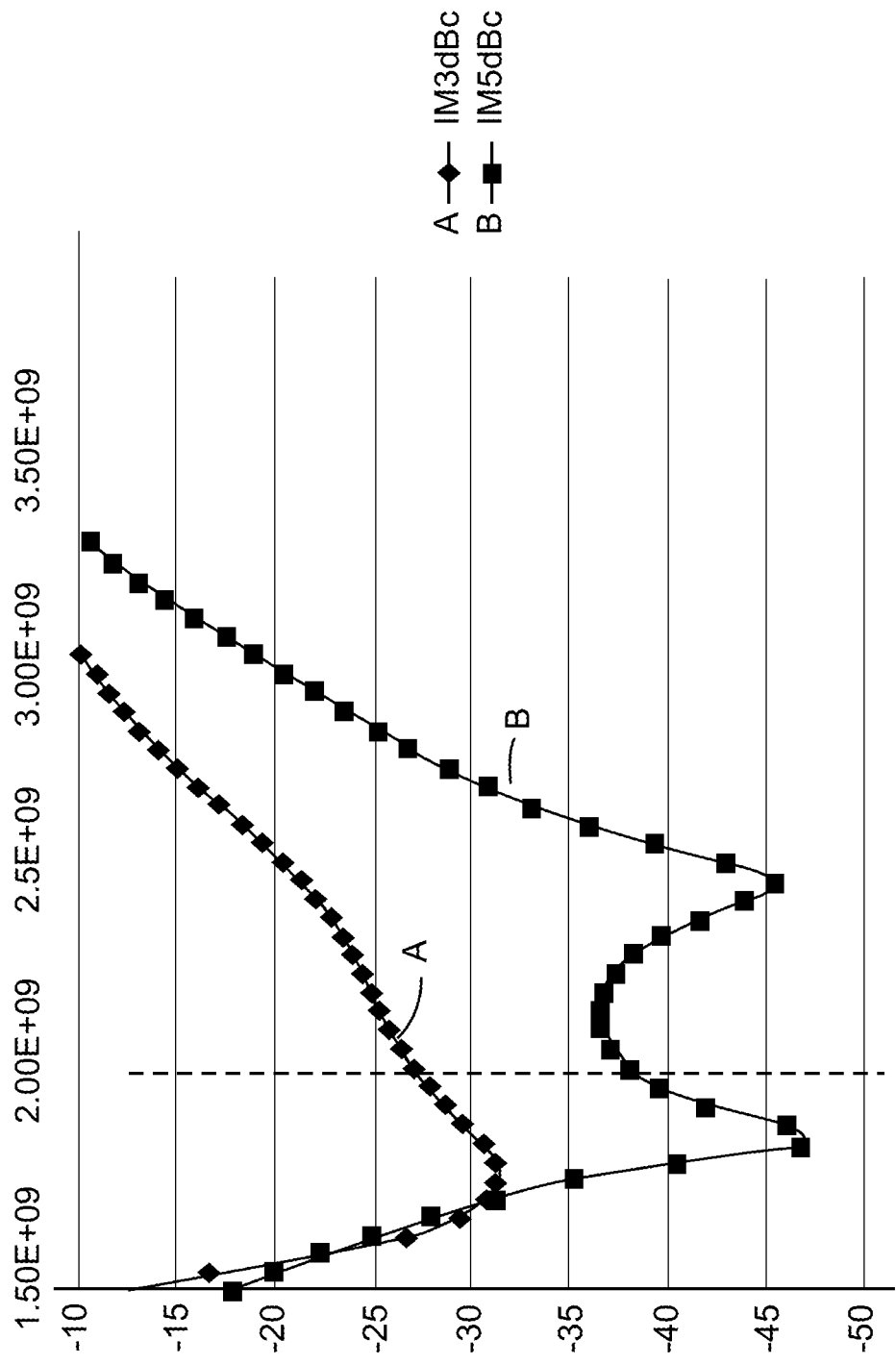
FIG. 14 illustrates simulation results showing a frequency response of the complex, passive, voltage mode sampling mixer circuit of FIG. 13A.

FIG. 13 illustrates a detailed component view of complex, passive, voltage mode sampling (CVPM) mixer circuit 1300 according to a second alternate embodiment, and FIG. 14 illustrates simulation results showing a frequency response of CPVM mixer circuit 1300 of FIG. 13. CPVM mixer circuit 1300 includes Q channel complementary inputs/baseband filters 1302Qa and 1302Qb, harmonics filters 1304Qa and 1304Qb, and mixer 1306Q. The local oscillator signals input to mixer 1306Q are LOq+ and LOq−. There is a substantially similar arrangement for the I channel: I channel complementary inputs/baseband filters 1302Ia and 1302Ib, harmonics filters 1304Ia, and 1304Ib, and mixer 1306I. The local oscillator signals input to mixer 1306I are LOi+ and LOi−. The complementary outputs of mixers 1306Qa and 1306Ia are wired in parallel and connected to power amplifier 1308, the output of which is connected to transmit antenna 1310. Those of skill in the art can appreciate that antenna 1310 (as well as all of the other antennas shown and described) could also be a receive antenna, and an appropriately located isolator could be located on the output of power amplifier 1108 to prevent signals from being fed into its output.

As with the CPVM mixer circuit 900, 1100 of FIGS. 9 and 11, respectively, it should be understood that when using CPVM mixer circuit 1300, the modulation of the two channels, I and Q cannot overlap in time; that is, when mixing is occurring with regard to the I channel, it cannot occur simultaneously in the Q channel; therefore, a duty cycle limit of 25% is imposed according to an embodiment for each of LOq and LOi. According to an embodiment, either of the Q or I channels will be allowed to mix during a first 25% of the time, then a rest period of 25% will occur, then the other channel will be mixed, and then another rest period of 25%, and this repeats as needed.

Also part of CPVM mixer circuit 1300 are inductors $L_1$ and $L_2$. $L_1$ is connected to a first output of mixer 1306Q and a first output of mixer 1306I (which is also connected to a first input of power amplifier 1308). $L_2$ is connected to the second outputs of mixer 1306Q and 1306I (and is connected to the second input of power amplifier 1308). Each inductor, along with respective capacitance associated with the output impedance of each mixer 1306Q and 1306I, and the capacitance associated with the connected-to input of power amplifier 1308, forms an LC tank circuit, whose resonant frequency, $f_{Res}$, can be determined by the following:

$$f_{Res} = \frac{1}{\sqrt{2\pi LC}}, \quad (1)$$

wherein, L is the inductance of $L_1$ or $L_2$, and C is the capacitance of the mixers 1306, and power amplifier 1308, in parallel. That is, there are two LC tank circuits, one for each of the complementary outputs of mixers 1306Q and 1306I and respective complementary inputs of power amplifier 1308. FIG. 13B illustrates a circuit model equivalent for the Q channel of CPVM mixer circuit 1300 of FIG. 13A between the output of the Q channel mixer and power amplifier constructed in the form of an LC tank circuit according to an embodiment. In FIG. 13B, $C_{out-Q(1)}$ represents the circuit model equivalent of the output capacitance for a first complementary output of mixer 1306Q; similarly, $C_{out-I(1)}$ represents the circuit model equivalent of the output capacitance for a first complementary output of mixer 1306I. $C_{in-PA(1)}$ represents the circuit model equivalent of the input capacitance for a first complementary input of power amplifier 1308. A similar model has not been shown for the output capacitances of the second complementary outputs of 1306Q and 1306I, and the second complementary input of power amplifier 1308m, but which of course does exist.

FIG. 14 illustrates simulation results showing a frequency response of CPVM mixer circuit 1300 of FIG. 13. CPVM mixer circuit 1300 represents a substantial improvement over CPVM mixer circuit 1100 according to an embodiment, in that, as discussed below, its frequency response is about as good as that shown in FIG. 12, but it requires much less power, as it does not have two mixers per I and Q channel, respectively. Thus, in terms of performance in relationship to power, CPVM mixer circuit 1300 offers substantially more than CPVM mixer circuit 900 and CPVM mixer circuit 1100.

FIG. 14 illustrates amplitudes of certain harmonic signals for CPVM mixer circuit 1300 of the LO signal versus the LO frequency, which, in this simulation, was swept from about 1½ GHz to about 3½ GHz, wherein the LO frequency is normally, in operation, about 2 GHz. Line A represents the relative amplitude of the third harmonic of the LO as it was swept from about 1½ to about 3½ GHz in CPVM mixer circuit 1300. The third harmonic of the LO signal when using CPVM mixer circuit 1300 (Line A) exhibits a fairly significant dip in relative amplitude; it drops from about −11 dB or so, at about 1½ GHz, to about −31 dB at about 1.9 GHz. From there, it rises in a fairly consistent sloping manner, till it reaches about −10 dB again at about 3.2 GHz. Compared to FIG. 10 (which shows, for CPVM mixer circuit 900, at about 2.0 GHz, a relative amplitude of the third harmonic of about −17 dB) and FIG. 12 (which shows, for CPVM mixer circuit 1100, at about 2.0 GHz, a relative amplitude of the third harmonic of about −30 dB) this is a substantial and meaningful improvement in terms of suppression of the third harmonic of the LO frequency especially in view of power use, circuit simplicity, and component count, according to an embodiment.

Furthermore, there is also a substantial and meaningful improvement in the suppression of the fifth harmonic. The relative level of the fifth harmonic begins at about −17 dB at about 1½ GHz, and drops significantly and quickly to just over −45 dB at about 1.9 GHz. There is a hump, as shown in FIG. 14, that indicates a somewhat non-linear response between 2.0 GHz and about 2.6 GHz, but the relative amplitude never rises above −35 dB. Those of skill in the art can appreciate that the inclusion of passive reactive components, such as, for example, the inductors of FIG. 13A, can cause the resultant impedance from the harmonic filter to experience different resonances, thereby causing the non-linear response as shown in FIG. 13B. From about 2.6 GHz to about 3½ GHz, the frequency response for the fifth harmonic of CPVM mixer circuit 1300 rises fairly consistently to about −10 dB.

Further, as in CPVM mixer circuits 900 and 1100, the fifth harmonic of CPVM mixer circuit 1300 has a lowest attenuation point that is not exactly at the 2 GHz LO signal frequency, and the third harmonic lowest attenuation point of CPVM mixer circuit 1300 is also not exactly at the 2 GHz LO signal frequency, and is also different from that of the lowest attenuation point of the fifth harmonic. Those of skill in the art can readily appreciate that at such high frequencies, stray capacitances will have effects on resonance values of filters especially. In this case, there is stray capacitance associated with the mixers and the effect of stray capacitance changes as a function of frequency, which is readily apparent to those of skill in the art.

Compared to FIG. 10 (which shows, for CPVM mixer circuit 900, at about 2.0 GHz, a relative amplitude of the fifth harmonic of about −27 dB) and FIG. 12 (which shows, for CPVM mixer circuit 1100, at about 2.0 GHz, a relative amplitude of the fifth harmonic of about −37 dB) this is a substantial and meaningful improvement in terms of suppression of the fifth harmonic of the LO frequency especially in view of power use, circuit simplicity, and component count, according to an embodiment. Taking both frequency responses of the third and fifth harmonics into account, along with the lower power consumption, reduced component count, and simpler circuit design, CPVM mixer circuit 1300 exhibits the best characteristics overall.

Figure 15:
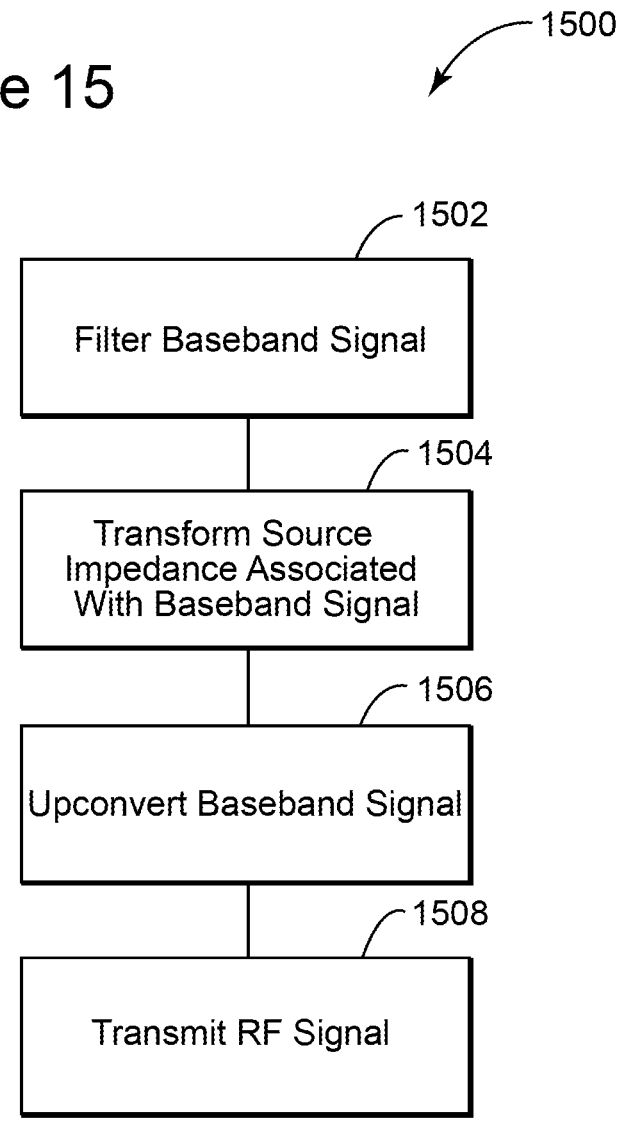
FIG. 15 is a flowchart illustrating a method of transmitting a radio signal according to an embodiment.

Thus, it will be appreciated by those skilled in the art that the preceding embodiments provide for, among other things, the application/usage of impedance transformation of the LC-filter in an up-converting passive voltage mode sampling mode modulator, in either or both of a simple mixer or a complex mixer circuit arrangement. Embodiments can also be expressed as methods for transmitting radio signals e.g., as shown in the flow chart of method 1500 illustrated in FIG. 15. Therein, a baseband signal is filtered at step 1502, e.g., to remove effects associated with upstream D/A conversion. The filtered baseband signal is input to an LC circuit (e.g., harmonics filter) that performs a transformation of the impedance seen by the downstream power amplifier at step 1504. The output of the harmonics filter is input to the mixer (or modulator) for up-conversion at step 1506, and the up-converted signal is then transmitted at step 1508 (e.g., after amplification by a power amplifier). The configuration of all of SPVM mixer circuits 400 and 500 according to embodiments, and all of CPVM mixer circuits 1100, 1300, and 1500 according to embodiments can be used with method 1500 represented by the flowchart of FIG. 15.

Figure 16:
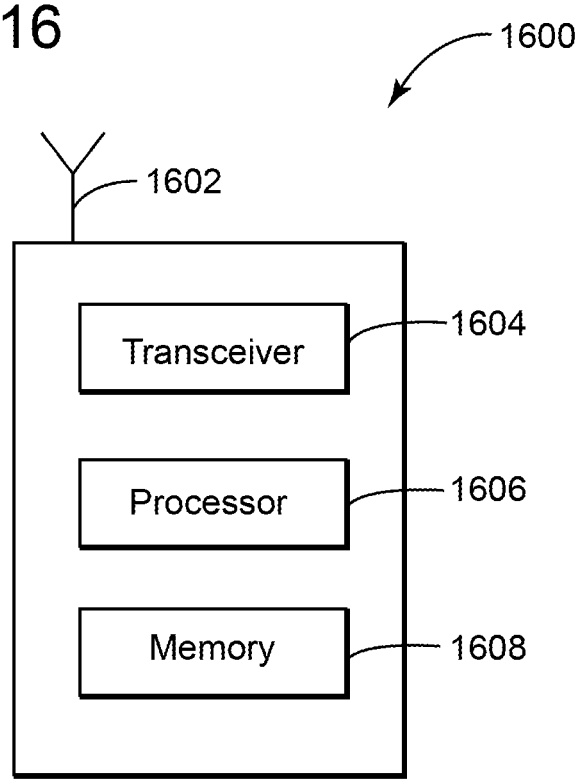
FIG. 16 depicts a communication device according to an embodiment.

The transmitters and methods described herein can be used in numerous devices associated with radio communications, e.g., mobile devices, access points, base stations, etc. Such devices 1600, generically illustrated in FIG. 16, can include one or more antennas 1602, a transceiver 1604, a processor or processors 1606 and one or more memory devices 1608. Processor 1606, or similar logic circuits or elements, can be configured to perform various functions associated with radio communication devices, e.g., call establishment, etc. The transceiver 1604 can include one or more simple mixers or complex mixers as described herein (e.g., simple mixers 400 and 500, and complex mixers 100, 1300, and 1500). Embodiments described herein may find applicability in any radio communication system.

The above-described exemplary embodiments are intended to be illustrative in all respects, rather than restrictive, of the present invention. Thus the present invention is capable of many variations in detailed implementation that can be derived from the description contained herein by a person skilled in the art. No element, act, or instruction used in the description of the present application should be construed as critical or essential to the invention unless explicitly described as such. Also, as used herein, the article "a" is intended to include one or more items.

What is claimed is:

1. A passive, voltage mode transmitter assembly comprising:
   a baseband filter configured to filter a source baseband signal;
   a harmonics filter connected to said baseband filter and configured to remove harmonics from said filtered baseband signal;
   a passive, voltage mode mixer, connected to said harmonics filter and configured to up-convert said harmonics-filtered source baseband signal to a radio signal; and
   a power amplifier connected to said passive voltage mode mixer and configured to amplify said radio signal.

2. The passive, voltage mode transmitter assembly according to claim 1, wherein said harmonics filter removes said harmonics with an inductor and a capacitor arranged as a shunt resonator.

3. The passive, voltage mode transmitter assembly according to claim 2, wherein said shunt resonator has a resonance frequency of between about three-and-one-half times and about four-and-one-half times a frequency of a carrier signal of said radio signal.

4. The passive, voltage mode transmitter assembly according to claim 1, wherein said harmonics filter removes said harmonics with an inductor and a capacitor arranged as a parallel resonator.

5. The passive, voltage mode transmitter assembly according to claim 4, wherein said parallel resonator has a resonance frequency of between about three-and-one-half times and about four-and-one-half times a frequency of a carrier signal of said radio signal.

6. A personal cellular communications device, comprising:
   the passive, voltage mode transmitter assembly according to claim 1.

7. The passive, voltage mode transmitter assembly according to claim 1, wherein said mixer includes an I channel mixer and a Q channel mixer, such that said passive, voltage mode transmitter assembly can operate as a complex passive, voltage mode transmitter assembly.

8. The passive, voltage mode transmitter assembly according to claim 7, further comprising:
   dual LC tank circuits.

9. The passive, voltage mode transmitter assembly according to claim 8, wherein
   said harmonics filter removes said harmonics with an inductor and a capacitor arranged as a parallel resonator,
   an I channel mixer for an I channel, and a Q channel mixer for a Q channel, each having respective first and second complementary outputs, and
   said dual LC tank circuits include,
      an I channel LC tank circuit including a first inductor with a first end connected to ground, and a second end connected to the first complementary output of said I channel mixer and the first complementary output of said Q channel mixer, said first complementary output of said I channel mixer and said first complementary output of said Q channel mixer being connected to a first complementary input of the power amplifier; and a Q channel LC tank circuit including a second inductor with a first end connected to ground, and a second end connected to the second complementary output of said I channel mixer and the second complementary output of said Q channel mixer, and wherein said second complementary output of said I channel mixer and said second complementary output of said Q channel mixer are connected to a second complementary input of the power amplifier.

10. A method for transmitting a radio signal in a passive voltage mode transmitter assembly, the method comprising:
performing an initial filtering of a source baseband signal using a baseband filter;
filtering said filtered source baseband signal using a harmonics filter;
up-converting said harmonics-filtered source baseband signal using a passive, voltage mode mixer to generate a radio signal; and
amplifying said radio signal.

11. The method for transmitting a radio signal in a passive, voltage mode transmitter assembly according to claim 10, wherein said filtering removes said harmonics with an inductor and a capacitor arranged as a shunt resonator.

12. The method for transmitting a radio signal in a passive, voltage mode transmitter assembly according to claim 11, wherein said shunt resonator has a resonance frequency of between about three-and-one-half times and about four-and-one-half times frequency of a carrier signal of said radio signal.

13. The method for transmitting a radio signal in a passive, voltage mode transmitter assembly according to claim 10, wherein said filtering removes said harmonics with an inductor and a capacitor arranged as a parallel resonator.

14. The method for transmitting a radio signal in a passive, voltage mode transmitter assembly according to claim 13, wherein said parallel resonator has a resonance frequency of between about three-and-one-half times and about four-and-one-half times a frequency of a carrier signal of said radio signal.

15. The method for transmitting a radio signal in a passive, voltage mode transmitter assembly according to claim 10, wherein said up-converting is performed with a simple, passive, voltage mode sampling mixer or with a complex, passive, voltage mode sampling mixer that includes an I channel mixer and a Q channel mixer.

* * * * *